United States Patent
Su et al.

(10) Patent No.: US 7,799,646 B2
(45) Date of Patent: Sep. 21, 2010

(54) INTEGRATION OF A SENSE FET INTO A DISCRETE POWER MOSFET

(75) Inventors: Yi Su, Sunnyvale, CA (US); Anup Bhalla, Santa Clara, CA (US); Daniel Ng, Campbell, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 87 days.

(21) Appl. No.: 12/098,970

(22) Filed: Apr. 7, 2008

(65) Prior Publication Data

US 2009/0250770 A1      Oct. 8, 2009

(51) Int. Cl.
   *H01L 21/336* (2006.01)
(52) U.S. Cl. .................................. 438/284; 438/286
(58) Field of Classification Search .................. 438/284, 438/286
   See application file for complete search history.

(56) References Cited

U.S. PATENT DOCUMENTS

| | | | |
|---|---|---|---|
| 5,079,456 A | 1/1992 | Kotowski et al. | |
| 5,408,141 A | 4/1995 | Devore et al. | |
| 5,962,912 A | 10/1999 | Hierold | |
| 6,414,404 B1 * | 7/2002 | Allen | 307/130 |
| 7,638,841 B2 * | 12/2009 | Challa | 257/341 |
| 2007/0131938 A1 * | 6/2007 | Williams | 257/77 |
| 2009/0039869 A1 * | 2/2009 | Williams | 324/123 R |

* cited by examiner

*Primary Examiner*—Douglas M Menz
(74) *Attorney, Agent, or Firm*—Joshua D. Isenberg; JDI Patent

(57) ABSTRACT

A semiconductor device includes a main field effect transistor (FET) and one or more sense FETs, and a common gate pad. The main FET and the one or more sense FETs are formed in a common substrate. The main FET and each of the sense FETs include a source terminal, a gate terminal and a drain terminal. The common gate pad connects the gate terminals of the main FET and the one or more sense FETs. An electrical isolation is disposed between the gate terminals of the main FET and the one or more sense FETs. Embodiments of this invention may be applied to both N-channel and P-channel MOSFET devices.

12 Claims, 11 Drawing Sheets

INTEGRATION OF A SENSE FET INTO A DISCRETE POWER MOSFET

FIELD OF THE INVENTION

Embodiments of this invention generally relate to semiconductor devices and more particularly to semiconductor devices including a power MOSFET and one or more sense MOSFETs with common gate and drain terminals and separate source terminals.

BACKGROUND OF THE INVENTION

One method for determining the current through a load in a circuit is to use a metal oxide semiconductor field effect transistor (MOSFET) for current sensing. Current sensing power MOSFETs conventionally include several thousand transistor cells arranged in parallel and sharing common drain, source and gate electrodes. Each transistor cell or element within the device is identical and current applied at the drain terminal of the device is shared equally between them. In such designs, it is common that the source electrodes of several of the transistors are separated from the remaining source electrodes and connected to a separate source terminal. Accordingly, the resulting current sensing MOSFETs can be thought of as equivalent to two or more transistors in parallel having common gate and drain terminals, but separate source terminals. The first of these transistors, including the majority of the transistor cells in the current sensing power MOSFET, is commonly referred to as the main FET. The second, including the several transistor cells having a separate source terminal, is referred to as the sense FET.

In use, the sense FET conducts only a small fraction of current applied to the common drain terminal, the fraction being inversely proportional to a sense ratio, n, which is a current ratio dependent on the ratio of the number of transistor cells in the main FET to those in the sense FET. The sense ratio n is defined for a condition in which the source terminals of the sense and main FETs are held at the same potential. When the sense ratio is known, the total current flowing through the device, and therefore the load current of a load to which the device is connected, can be calculated from a measurement of the source current of the sense FET, i.e. the current flowing in the current path of the sense FET, between the drain and source electrodes.

However, the wire bonding between the sense FET and the main FET will affect the performance of the device. Furthermore, it would be desirable to develop a power device integrating one or multiple sense FETs into one discrete power MOSFET, in a manner which does not increase number of mask layers and manufacturing process sequences. It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
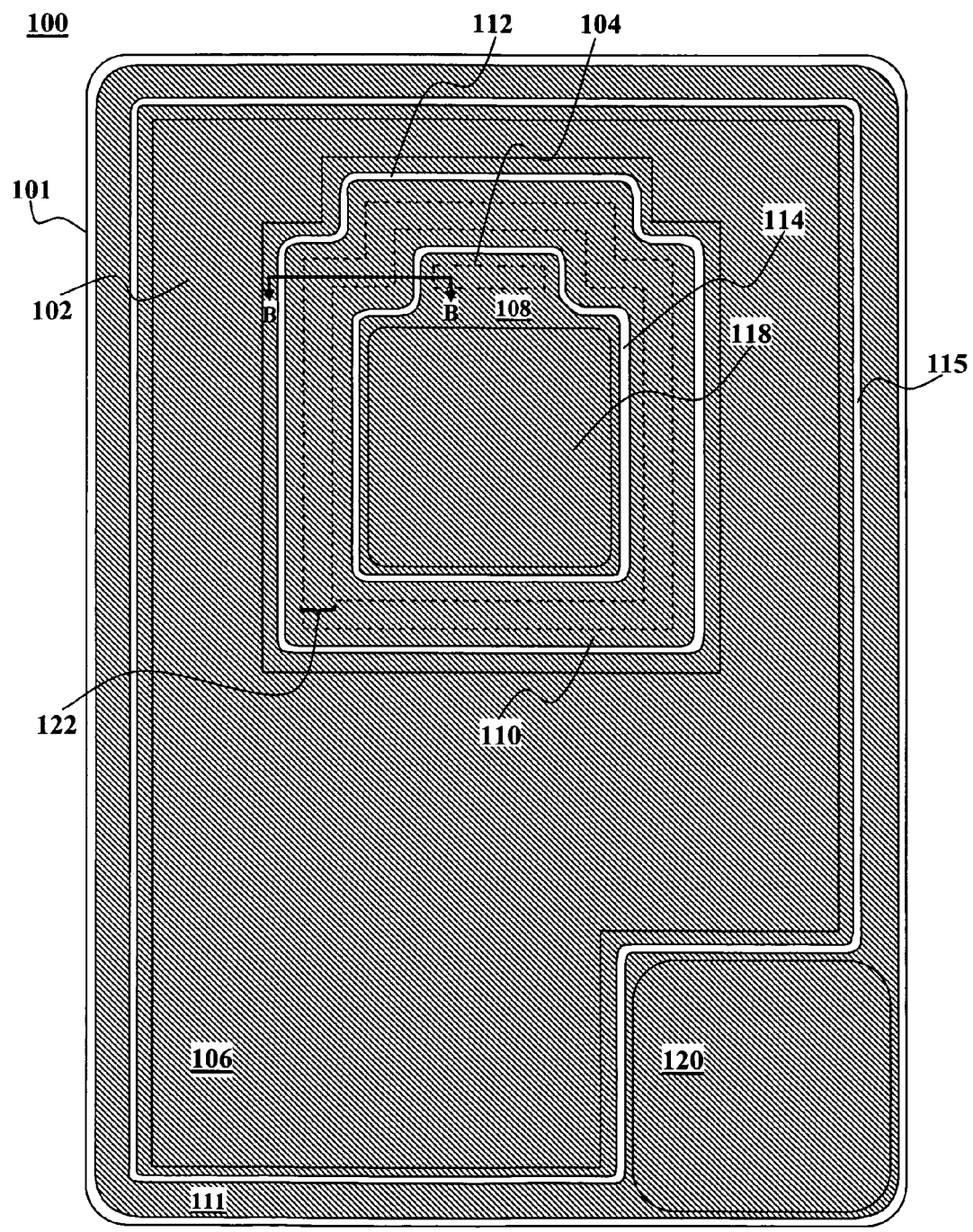
FIG. 1 is a top plan view showing a top view of the semiconductor device according to an embodiment of the present invention.
Figure 1A:
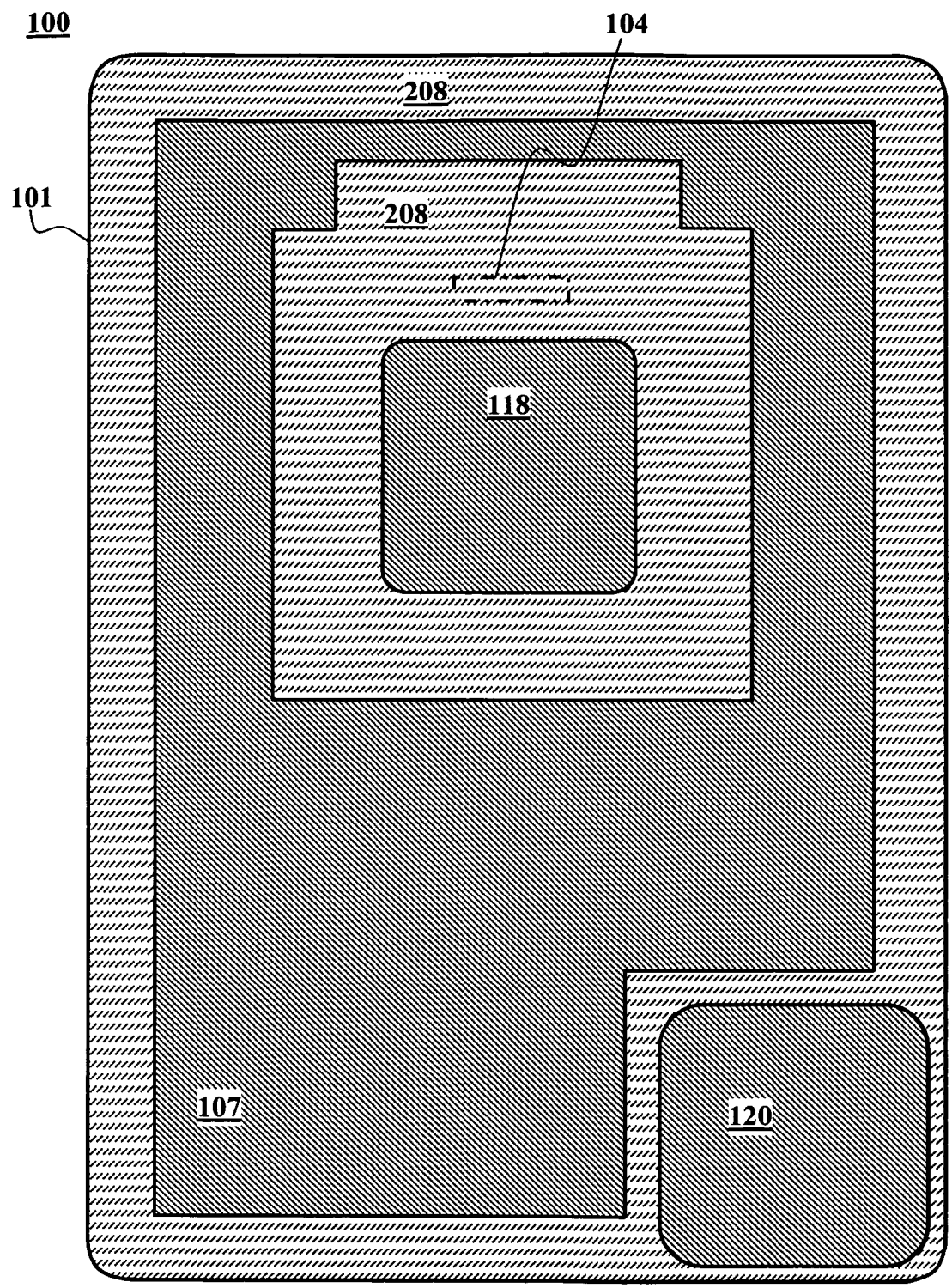
FIG. 1A is a top plan view showing a top view of the semiconductor device showing the passivation layer according to an embodiment of the present invention.
Figure 2:
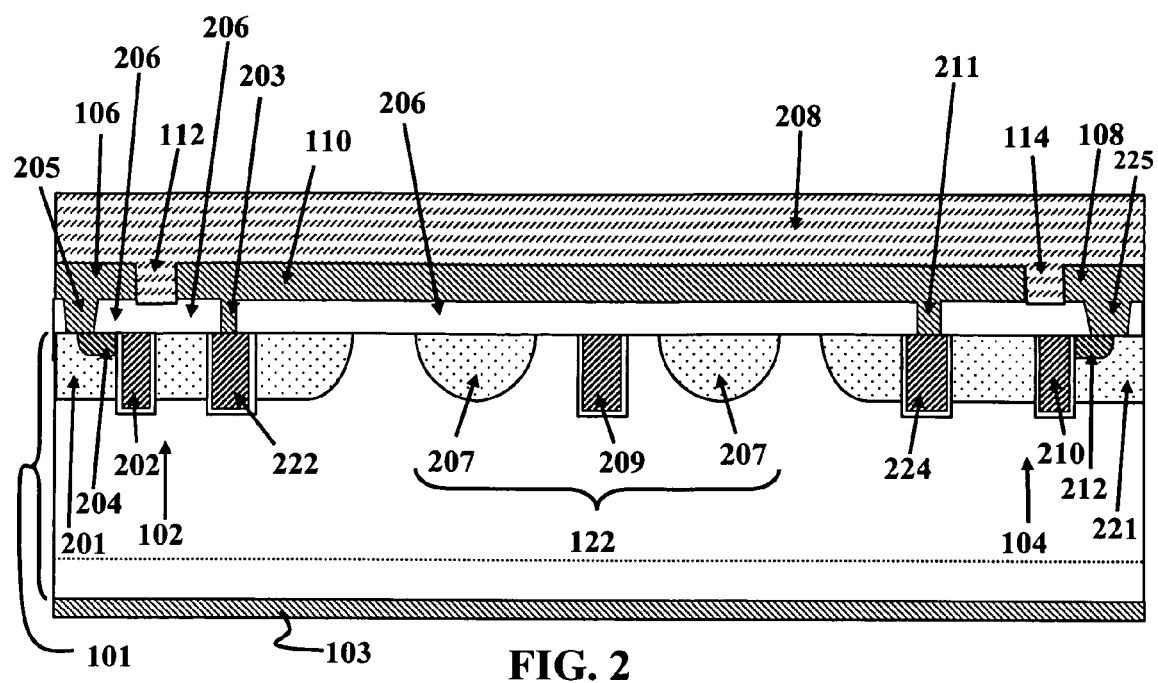
FIG. 2 is a cross-sectional schematic diagram of the semiconductor device of FIG. 1 taken along line B-B.

Certain aspects of embodiments of the invention may be understood by referring simultaneously to FIG. 1, FIG. 1A and FIG. 2. FIG. 1 illustrates a top plan view of a semiconductor device 100 according to an embodiment of the present invention. As shown in FIG. 1, the semiconductor device 100 includes a common substrate 101, a main FET 102, disposed in the common substrate 101, and one or more sense FETs 104, also disposed in the common substrate. As shown in the example depicted in FIG. 1, the sense FET 104 may be built in an area surrounded by active areas of the main FET 102. The main FET 102 may be a metal oxide semiconductor field effect transistor (MOSFET), typically a power MOSFET, and can be arranged as stripe cells or closed cells. The sense FET 104 also can be a metal oxide semiconductor field effect transistor (MOSFET), which can be arranged as stripe cells or closed cells. The main FET 102 and the sense FET 104 are both formed from the common substrate 101. The main FET 102 and sense FET 104 each includes their own source, gate and drain structures. The source structures are formed in a body layer of the common substrate 101. A drain pad 103 (seen in FIG. 2) is formed on a back side of the substrate 101.

The gate and source structures that make up the main FET 102 generally lie underneath the main FET source metal 106. The source structures of the sense FET 104 are electrically connected to a sense FET source metal 108. The gate and source structures that make up the sense FET 104 generally lie under a portion of the sense FET source metal 108. However, these structures generally do not lie underneath the sense FET source pad 118 (sometimes referred to as a sense pad) to avoid damage caused by wire bonding impact. Because the number of sense FET cells is usually in orders of magnitude smaller than the number of the main FET cells, such damage to the sense FET cells would greatly affect the accuracy of designed sense ratio. The main FET cells are also exposed to damage from wire bonding impact, but the number of main FET cells damaged is relatively small compared to the total number of main FET cells, so that does not greatly affect the accuracy of the designed sense ratio. The sense FET source metal 108 may cover the whole sense FET source regions and extend to an area without active sense FET cells 104 where the sense pad may be formed directly on the FET source metal 108 or over a passivation layer over the sense FET source metal 108. The passivation layer is not shown in FIG. 1 for the sake of simplicity. FIG. 1A shows the same top view as FIG. 1, but also shows a passivation layer 208 and the windows opened in the passivation layer 208 to allow bonding to the main FET source metal 106, sense FET source metal 108, and outer gate metal 111 according to one embodiment of the invention. The metal exposed by the windows in the passivation layer 208 in effect form the gate pad 120, the main FET source pad 107, and the sense FET source pad 118. It is clear that the sense FET 104 is not located directly under the sense FET source pad 118.

The gate structures of the main FET 102 and the sense FET 104 are electrically connected to each other by a common gate metal 110. A first metal gap 112 may electrically isolate the main FET source metal 106 from the common gate metal 110. A second metal gap 114 may be located between the common gate metal 110 and the sense FET source metal 108. A third metal gap 115 may be located between the main FET source metal 106 and the outer gate metal 111. Electrical connection between the gate terminals of the main FET 102 and sense FET 104 and the common gate metal 110 may be implemented e.g., by conductor-filled trenches (not shown in FIG. 1) formed in the body of the substrate 101 and electrically isolated from the substrate by a layer of oxide lining the walls of the trenches. These conductor-filled trenches also connect the common gate metal 110 with the outer gate metal 111. The main FET source metal 106, sense FET source metal 108, outer gate metal 111 and common gate metal 110 may be formed from a single patterned metal layer deposited over the substrate 101. The gate pad 120 may be disposed on the outer gate metal 111.

The main FET source metal 106, sense FET source metal 108, outer gate metal 111 and common gate metal 110 may be covered by a passivation layer 208 (seen in FIG. 1A and FIG. 2). External electrical connection to the main FET source metal 106 may be made through vias in the passivation layer 208 to a main FET source pad disposed on the passivation layer 208. Alternatively, the main FET source pad may be formed from a portion of the main FET source metal 106 itself that is exposed through a window in the passivation layer 208. In a similar fashion, external electrical connection to the sense FET source metal 108 may be made through the passivation layer 208 to a sense FET source pad 118 (sense pad) disposed on the passivation layer over the sense FET source metal 108. Alternatively, the sense FET source pad 118 may be formed from a portion of the sense FET source metal 108 which is exposed through a window in the passivation layer 208. It is common for nearly the entire surface of the main FET source metal 106 to be made available for bond wire bonding. In addition, external electrical connection to the gate metal 110 may be made through the passivation layer to a gate pad 120 disposed on the passivation layer over the gate metal 110. However, in the embodiment shown in FIG. 1, FIG. 1A, and FIG. 2 the gate pad 120 is formed from the outer gate metal 111. The common gate metal 110 and the outer gate metal 111 are connected underneath by gate runner trenches 222 (FIG. 2). The drains of the main FET 102 and the sense FET 104 may be electrically connected through the lower portion of the substrate 101 to a common drain pad 103 (seen in FIG. 2), which may be formed on a back side of the common substrate 101.

The semiconductor device 100 also includes an electrical isolator 122 formed in a body layer of the common substrate 101 between the main FET 102 and the sense FET 104 as shown in FIG. 2. In the example depicted in FIG. 1, the electrical isolator 122 is located between the first metal gap 112 and the second metal gap 114. By way of example, the electrical isolator 122 may be implemented in the form of a combination of doped body 207 and trench rings 209. The electrical isolator 122 provides electrical isolation between the source structures of the main FET 102 and the sense FET 104 within the body of the common substrate 101.

As shown in FIG. 2, the main FET 102 may include a plurality of FET structures, each of which includes a trenched gate 202, and a source 204 formed by suitable doping of portions of a body region 201 of the substrate 101. The gate 202 for each main FET device may be in the form of a trench lined with an insulator such as an oxide and filled with conductive polysilicon. The gates 202 may run perpendicular to the B-B cross section and across one or more trench gates running in parallel to the B-B cross section and electrically connected to gate runner trench 222, which makes electrical contact with the common gate metal 110 through an insulating layer 206 by way of one or more conductive vias 203. The gate runner trench 222 also connects to the outer gate metal 111. The source 204 of one main FET cell may be connected in parallel to other such devices by a main FET source metal 106, The source region 204 may make electrical contact to the main FET source metal 106 through an insulating layer 206 by conductive vias 205. The main FET source metal 106 may make electrical contact to the main FET source pad by way of conductive vias formed through portions of the passivation layer 208 that underlies the source pad and overlies the main FET source metal 106. Alternatively, the main FET source pad can be formed from a section of the main FET source metal 106 uncovered by a window in the passivation layer 208. It is common to allow nearly the entire surface of the main FET source metal 106 to be available as bonding area for bond wires.

The sense FET 104 may similarly include a plurality of device structures, each of which may include a trenched gate 210 electrically coupled to gate runner 224 through one or more perpendicular gate trenches. The gate runners 224 are connected to the common gate metal 110 by vias 211. From the common gate metal 110, the gate runners 224 are also electrically connected to the gate pad 120 by way of the outer gate metal 111 and gate runners 222. Sense FET source 212 is electrically coupled to other sense FET cells sources by way of a sense FET source metal 108 through vias 225. The trenched gate 210, source 212 and body region 221 may be configured as described above with respect to the main FET gate 202, source 204 and body 201. The sense FET source metal 108 may make electrical contact to the sense FET source pad (sense pad) 118 through conductive vias formed in the passivation layer 208. Alternatively the sense pad can be formed from a portion of sense FET source metal 108 which is exposed through a window in the passivation layer 208. The common gate metal 110 electrically connects the trenched gate runners 222 of the main FET 102 with the trenched gate runners 224 of the sense FET 104. The first metal gap 112 electrically isolates the main FET source metal 106 from the common gate metal 110, and the second metal gap 114 electrically isolates the sense FET source metal 108 and the common gate metal 110.

As discussed above, the source and body regions of the main FET and sense FET devices are formed in the same substrate 101. The electrical isolator 122 isolates these two source and body regions. By way of example, the electrical isolator 122 may include body implant rings 207 and an electrically isolated and electrically floating poly-filled trench 209 to provide electrical isolation between the main FET 102 and the sense FET 104. The body implant rings 207 may be formed by suitably doping portions of the substrate 101. The trench 209 may have a configuration like that of the trench gates 202, 210, but it is electrically isolated from the trench gates. To electrically isolate the main FET and sense FET source metals 106 and 108, and common gate metal 110, the passivation layer 208 may fill in the metal gaps 112 and 114 and is disposed on top of the main FET source metal 106, sense FET source metal 108 and the common gate metal 110. Alternatively, a portion or all of passivation layer 208 may be eliminated and bond wire may directly bond to main FET source metal 106, sense FET source metal 108 and the common gate metal 110 respectively.

Figure 3A:
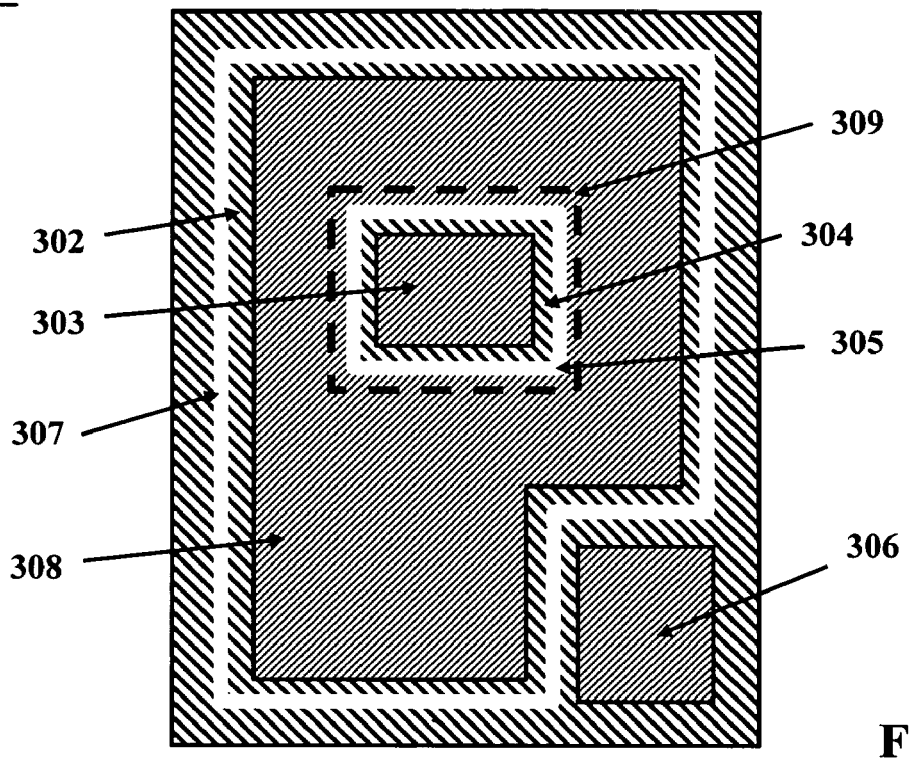
FIGS. 3A-3D are schematic diagrams showing top views of alternative sense FET configurations for a semiconductor device according to an embodiment of the present invention.

There are a number of different possible layouts for semiconductor devices according to embodiments of the present invention. FIGS. 3A-3D are schematic diagrams showing top views of just a few of the many possible alternative sense FET configurations for a semiconductor device according to an embodiment of the present invention. By way of example, a semiconductor device 300 may include a sense FET may be built inside an active area of the main FET, as shown in FIG. 3A. The semiconductor device 300 includes a sense FET 304 located proximate the center of the main FET 302. Source metal for the main FET 302 and sense FET 304 lies between the FETS and corresponding source pads 303 and 308, and a gate pad 306. Gaps 305, 307 are formed in a common metal layer to divide it into a gate metal region and source metal regions for the main FET 302 and the sense FET 304. The source pads 303, 308 for the main FET and sense FET overlie the corresponding metal regions. The gate pad 306 overlies a portion of the gate metal region. An electrical isolator 309 indicated by the dashed line may be formed in a body portion of the substrate in a suitable pattern to electrically isolate the source regions of the main FET 302 and sense FETS 304.

Figure 3B:
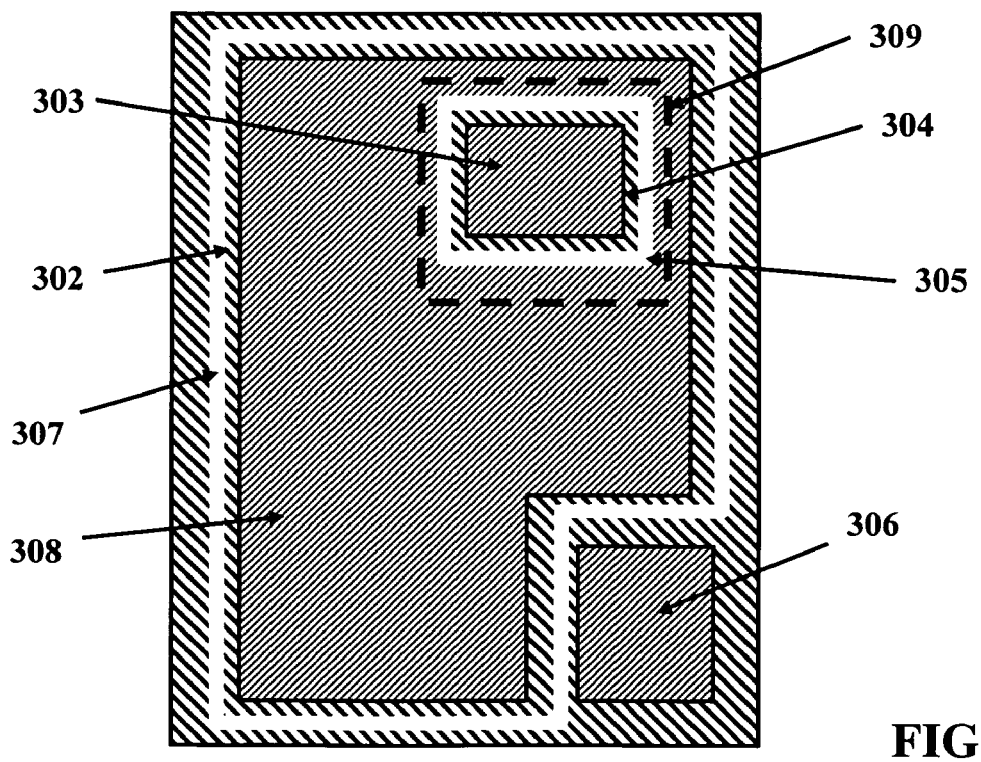
Figure 3C:
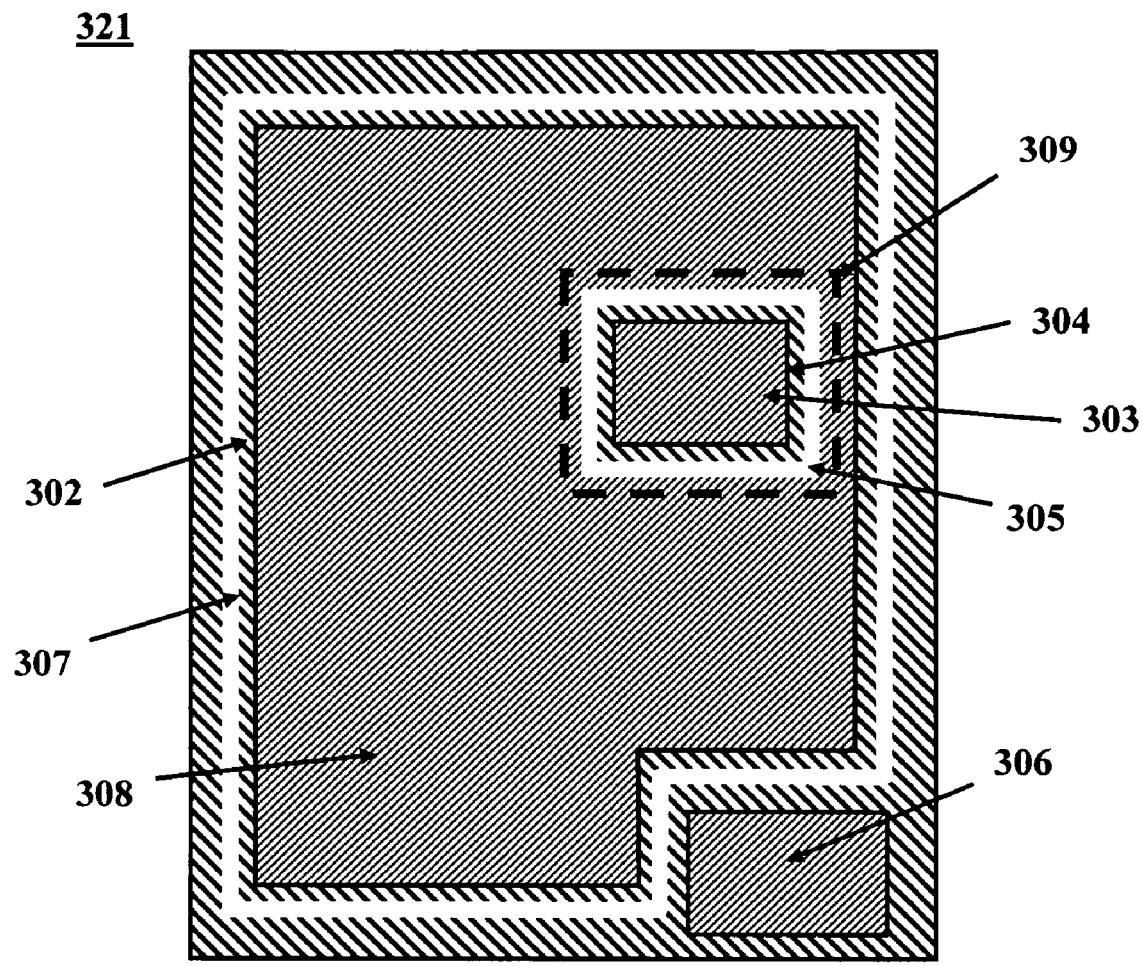

The sense FET 304 may be located proximate a corner of the main FET 302 as shown in the semiconductor device 301 of FIG. 3B. Alternatively, the sense FET 304 may be located proximate an edge of the main FET 302 as shown in the semiconductor 321 of FIG. 3C. Current ratio between main FET and sense FET may be adjusted by changing only one source mask layer.

Figure 3D:
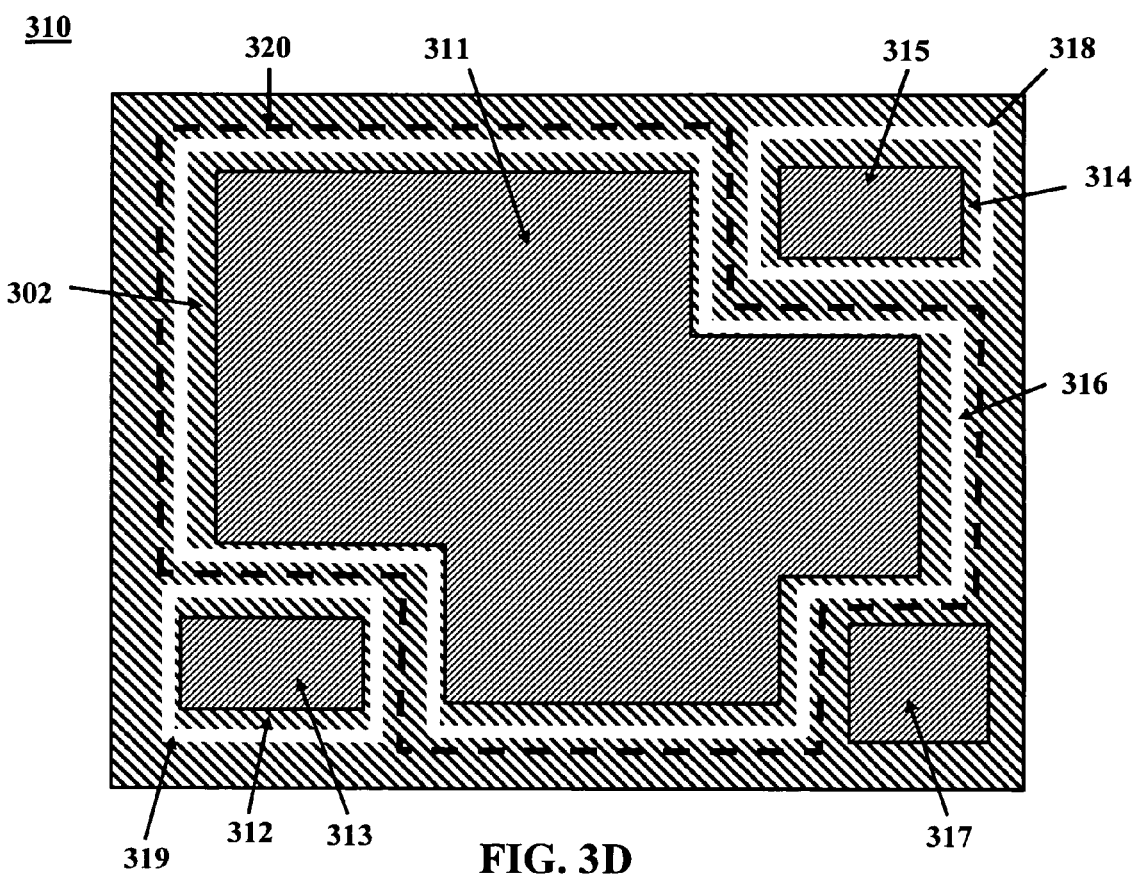

Multiple Sense FETs with a number of different current ratios may be easily integrated into main power MOSFET. FIG. 3D is showing a semiconductor device 310 including two sense FETs 312 and 314 located proximate corners of the main FET 302. Source metal for the main FET and two sense FETs lies between the FETs and corresponding source pads 311, 313, 315 and a gate pad 317. Gaps 316, 318, 319 are formed in a common metal layer to divide it into a gate metal region and source metal regions for the main FET and each sense FET. The source pads 311, 313, 315 for the main FET and sense FETS overlie the corresponding metal regions. The gate pad 317 overlies a portion of the gate metal region. An electrical isolator 320 indicated by the dashed line may be formed in a body portion of the substrate in a suitable pattern to electrically isolate the source regions of the main FET and sense FETS.

Figure 4A:
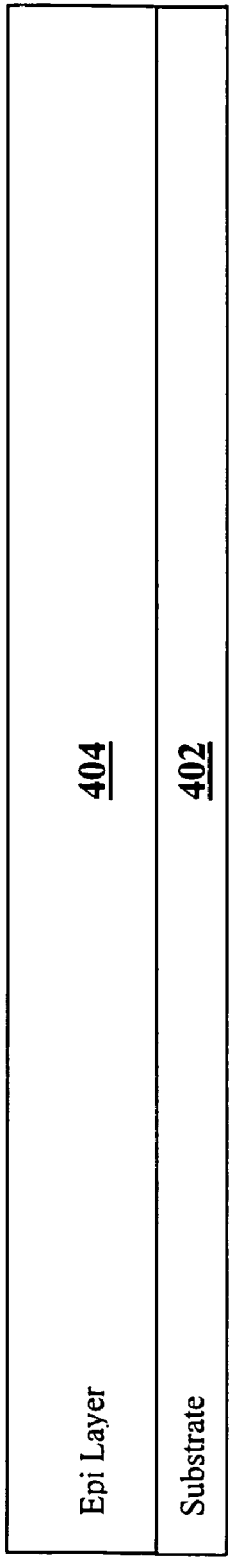
FIGS. 4A-4H are a series of cross-sectional schematic diagrams illustrating fabrication of a semiconductor device according to an embodiment of the present invention.
Figure 4B:
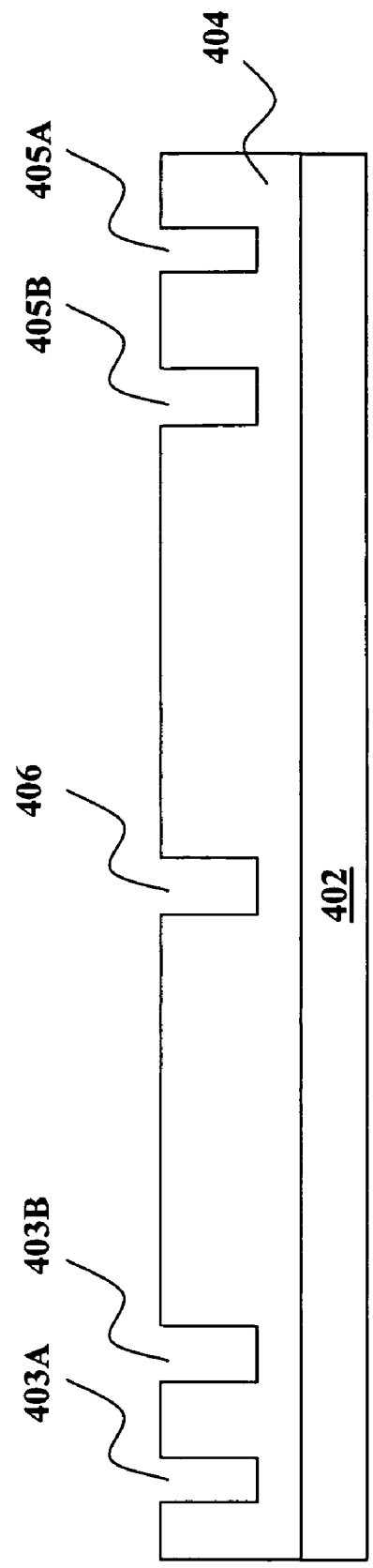
Figure 4C:
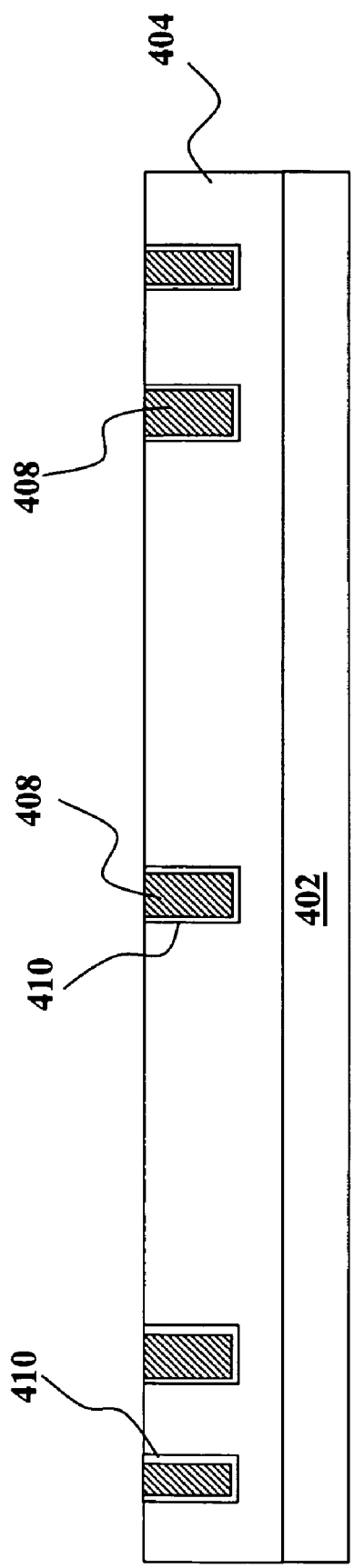

There are a number of different possible ways of fabricating semiconductor devices of the types discussed above. By way of example, FIGS. 4A-4H are a series of cross-sectional schematic diagrams illustrating fabrication of an N-channel MOSFET semiconductor device according to an embodiment of the present invention. A similar technique may be used to fabricate a P-channel MOSFET device. As shown in FIG. 4A, an N-epi layer 404 may be formed on top of an N+ substrate 402. A trench mask (not shown) is then formed on top of the N-epi layer 404. The N-epi layer 404 may be etched through the trench mask to a predetermined depth to form main FET gate trench 403A, main FET gate runner trench 403B, sense FET gate trench 405A, and sense FET gate runner trench 405B and isolation trench 406 as shown in FIG. 4B. Gate oxide 410 may then be grown on the sidewall of the trenches 403A, 403B, 405A, 405B and 406. The trenches 403, 405 and 406 may then be filled with a conductive material 408, such as polysilicon, and then etched back as shown in FIG. 4C. In this manner, source terminals, trench gates and isolation trenches may all be formed simultaneously in a common sequence of process steps.

Figure 4D:
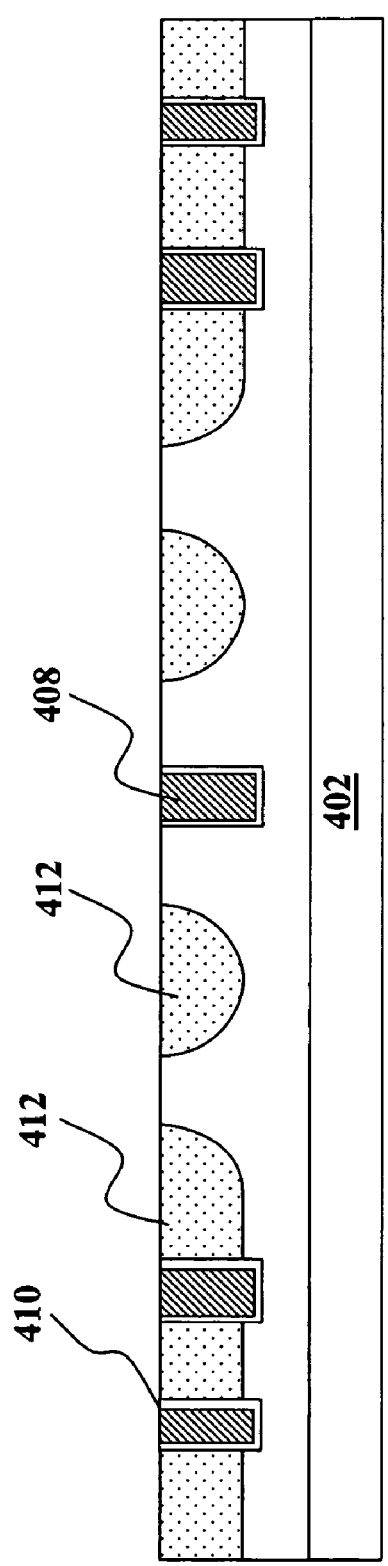

To form source regions and an electrical isolator, the epitaxial layer 404 may be implanted with dopants of an opposite polarity to the doping of the epitaxial layer. By way of example, with a body mask (not shown), P-type dopants 412 may be implanted and annealed in the N-epi layer 404 proximate the main FET gate trench 403A, main gate runner trench, 403B, sense FET gate trench 405A, sense FET gate runner trench 405B, and the isolation trench 406. The P-type dopants 412 proximate the isolation trench 406 forms body rings that help provide electrical isolation between the main FET and the sense FET as shown in FIG. 4D. In this manner the main FET and sense FET device regions as well as the body block rings may all be formed simultaneously in a common sequence of process steps. It is noted that in this example to fabricate an N-channel device, P-type dopants are implanted in the N-type doped epitaxial layer 404. Alternatively, N-type dopants may be implanted in a P-type doped epitaxial layer for fabrication of a P-channel device.

Figure 4E:
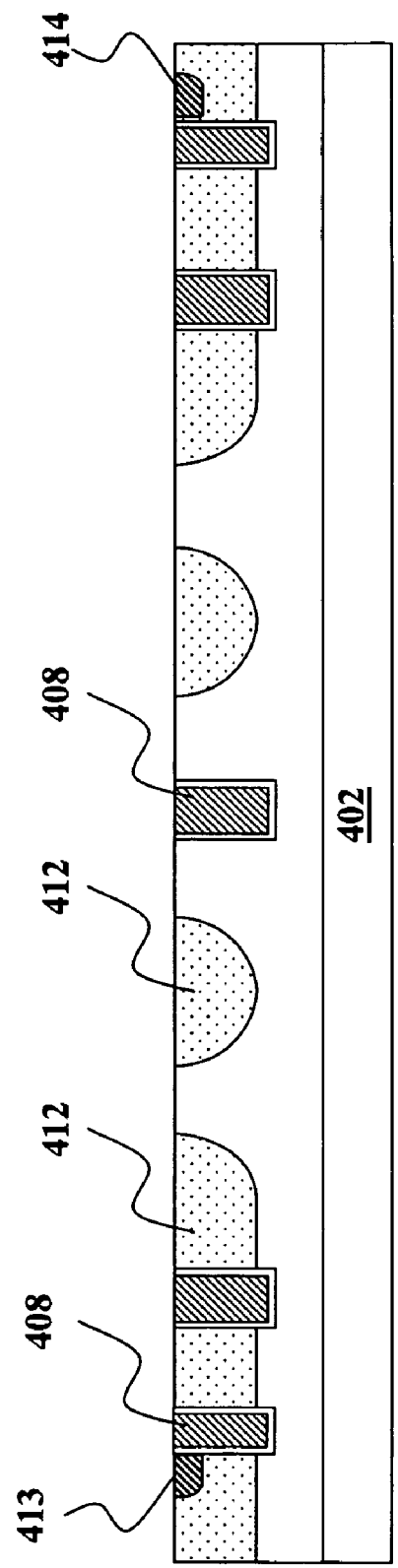
Figure 4F:
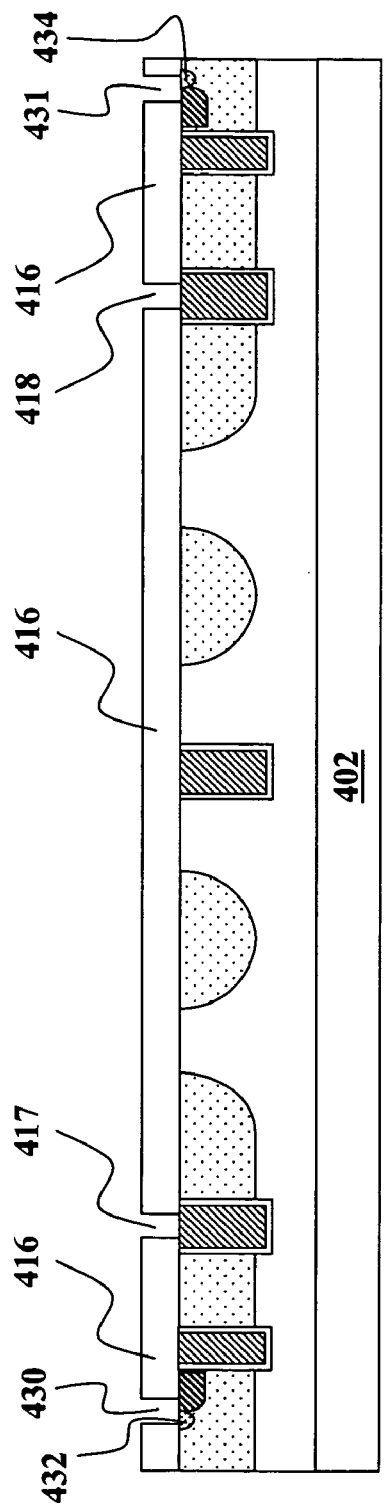

N+ type dopants are implanted and annealed to form a main FET source region 413 and the sense FET source region 414 as shown in FIG. 4E. An insulating layer 416, e.g., borophosphosilicate glass (BPSG), is depositing on top of the N-epi layer 404. The insulating layer 416 is etched back to form contact openings 417 and 418 located on top of the main FET gate runner trench 403B and sense FET gate runner trench 405B respectively; and to form contact opening 430 and 431 for the main FET source and sense FET source, respectively as shown in FIG. 4F. Contact implants 432, 434 can be implanted through the contact openings 430 and 431.

Figure 4G:
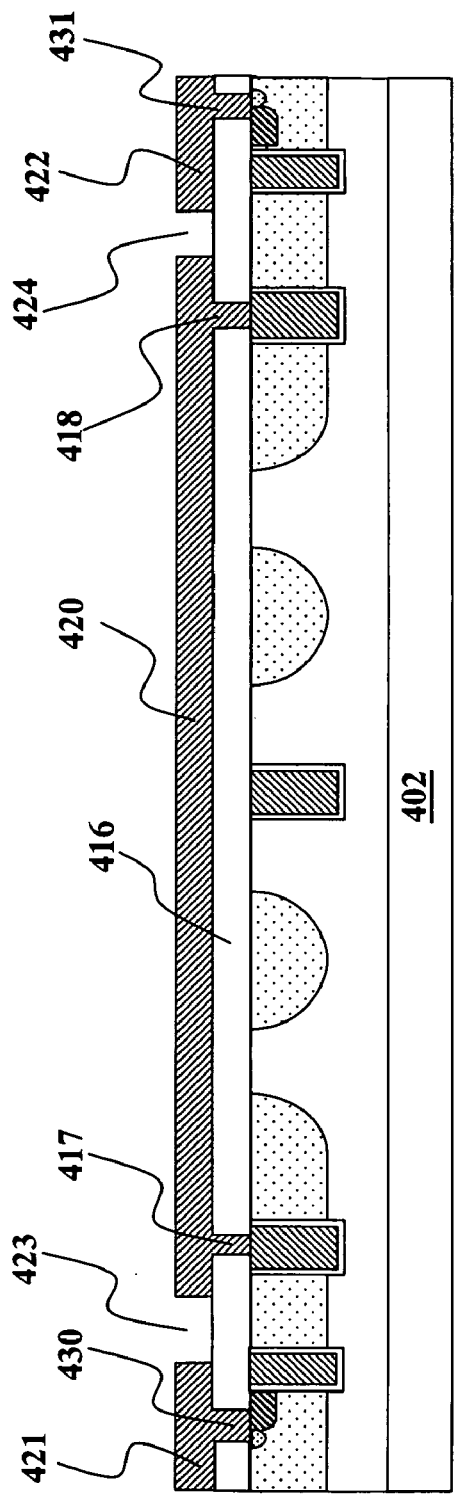
Figure 4H:
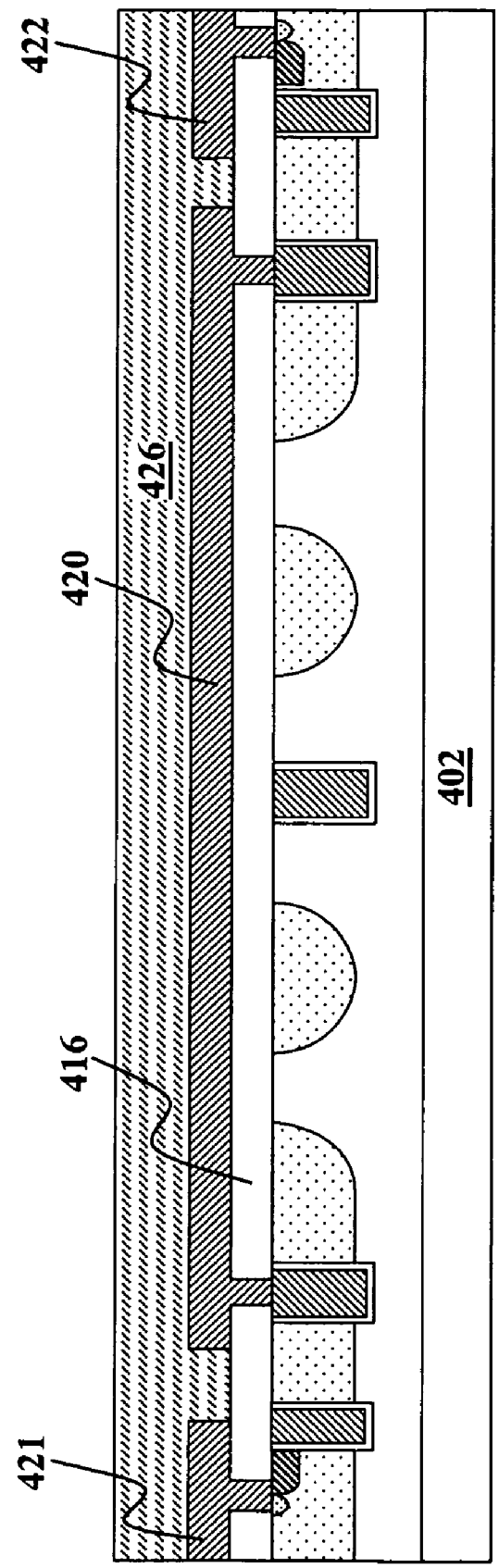

A conductive layer is deposited on top of the insulating layer 416 and into contact openings 417, 418, 430 and 431 and patterned to form a common gate metal 420 (which is electrically connected to the main FET gate runner trench 403B and the sense FET gate runner trench 405B), a main FET source metal 421 and a sense FET source metal 422. The conductive layer may be etched back to form opening 423 for isolation between the common gate metal 420 and the main FET source metal 421, and opening 424 for isolation between the common gate metal 420 and the sense FET source metal 422 as shown in FIG. 4G. A passivation layer 426 is finally deposited into the openings 417, 418 and deposited on top of the common gate metal 420, main FET source metal 421 and sense FET source metal 422 as shown in FIG. 4H.

The method described above in FIGS. 4A-4H only shows the making of an N-channel main FET and a sense FET on a common substrate with the sense FET not being located under the sense FET source pad. However, multiple sense FETs with a number of different current ratio can be easily formed on a common substrate with main FET using this method without additional manufacturing process and additional mask layers required. Embodiments of the present invention allow the main FET, the sense FET and the electrical isolation between them to be formed from the same semiconductor substrate using common process steps. Although the nature and sequence of the steps used in fabricating devices according to embodiments of the present invention may be common, the masks used during the process steps are different in that they provide for fabrication of the electrical isolation as well as the FET devices.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for manufacturing a semiconductor device including one main field effect transistor (FET) and one or more sense FETs, comprising:
   a) forming a source and a gate of a main FET in a substrate;
   b) forming a source and a gate of one or more sense FETs in the substrate;
   c) forming an electrical isolation in the substrate between the main FET and the one or more sense FETs; and
   d) electrically connecting the gate terminals of the main FET and the one or more sense FETs,
   whereby the main FET, the one or more sense FETs and the electrical isolation are formed in a common substrate
   wherein a) through d) include
   i) forming a first polarity type epitaxial (Epi) layer on top of a heavily doped first polarity type substrate;
   ii) forming a trench mask on top of the Epi layer;
   iii) etching the epi layer through the trench mask to a predetermined depth to form one or more main FET gate trenches, one or more sense FET gate trenches and one or more isolation trenches, wherein the isolation trenches are located in between the main FET gate trenches and the sense FET gate trenches;
   iv) filing the trenches with a conductive material to form main FET gate and sense FET gates;
   v) implanting opposite polarity type dopants in the epi layer proximate the isolation trenches to form an isolation between the main FET and the one or more sense FETs; and
   vi) forming a conductive layer between the main FET gate and the sense FET gates.

2. The method of claim 1, further comprising before iv) forming a gate oxidation layer on sidewalls of the trenches.

3. The method of claim 1, wherein step v) further comprises:
   implanting P-type dopants in the N-epi layer proximate the main FET gate trench and the sense FET gate trenches; and
   annealing the implanted P-type dopants.

4. The method of claim 3 further comprising implanting N-type dopants to form main FET source terminal and sense FET terminals.

5. The method of claim 4, wherein vi) comprises:
   depositing a borophosphosilicate glass (BPSG) layer on top of the N-epi layer;
   etching back the BPSG layer to form contact openings located on top of the main FET gate trench and sense FET gate trenches;
   depositing a conductive layer on top of the BPSG layer and into the contact openings to form a common gate pad of the main FET and the sense FETs and main FET source pad and sense FET source pads; and
   etching back the conductive layer to form openings for isolation between the common gate pad and the main FET source pad and between the common gate pad and the sense FET source pad.

6. The method of claim 5 further comprising depositing a passivation layer on top of the conductive layer.

7. The method of claim 1, wherein b) includes forming the one or more sense FETs inside an active area of the main FET.

8. The method of claim 1, wherein the main FET includes a metal oxide semiconductor field effect transistor (MOSFET).

9. The method of claim 8 wherein the MOSFET is a power MOSFET.

10. Method of claim 1 wherein the one or more sense FETs include one or more metal oxide semiconductor field effect transistors (MOSFETs).

11. The method of claim 1 wherein a), b) and c) include forming a trenched main FET gate, one or more trenched sense FET gates and an isolation trench in a common sequence of one or more process steps.

12. The method of claim 1 wherein a), b) and c) include doping a main FET device region, one or more sense FET device regions and one or more body block regions of the electrical isolation in a common sequence of process steps.

* * * * *